(12) United States Patent
Commin et al.

(10) Patent No.: US 12,513,949 B2
(45) Date of Patent: Dec. 30, 2025

(54) SEMICONDUCTOR DEVICE WITH A SIDE SURFACE HAVING DIFFERENT PARTIAL REGIONS

(71) Applicant: HITACHI ENERGY LTD, Zürich (CH)

(72) Inventors: Paul Commin, Zürich (CH); Kranthi Kumar Akurati, Seon (CH); Jagoda Dobrzynska, Lenzburg (CH)

(73) Assignee: HITACHI ENERGY LTD, Zürich (CH)

( * ) Notice: Subject to any disclaimer, the term of this patent is extended or adjusted under 35 U.S.C. 154(b) by 418 days.

(21) Appl. No.: 18/038,845

(22) PCT Filed: Nov. 16, 2021

(86) PCT No.: PCT/EP2021/081856
§ 371 (c)(1),
(2) Date: May 25, 2023

(87) PCT Pub. No.: WO2022/112059
PCT Pub. Date: Jun. 2, 2022

(65) Prior Publication Data
US 2024/0021672 A1 Jan. 18, 2024

(30) Foreign Application Priority Data
Nov. 27, 2020 (EP) ..................................... 20210372

(51) Int. Cl.
H10D 62/10 (2025.01)
H10D 18/00 (2025.01)
(52) U.S. Cl.
CPC ........... H10D 62/104 (2025.01); H10D 18/00 (2025.01)

(58) Field of Classification Search
CPC .............................. H10D 18/00; H10D 62/104
See application file for complete search history.

(56) References Cited

U.S. PATENT DOCUMENTS 3,179,860 A 4/1965 Clark et al.
3,255,055 A 6/1966 Ross
(Continued)

FOREIGN PATENT DOCUMENTS

CN 108206213 A 6/2018
CN 111742411 A 10/2020
(Continued)

OTHER PUBLICATIONS

Crees, "Design aspects of large thyristors", Jan. 1, 1988, Jan. 1, 1988 (Jan. 1, 1988), pp. 3/1-3/6, XP006526199.

Primary Examiner — Wasiul Haider
(74) Attorney, Agent, or Firm — Procopio, Cory, Hargreaves & Savitch LLP

(57) ABSTRACT

A semiconductor device with a semiconductor body is specified, the semiconductor body extending in a vertical direction between a first main surface and a second main surface opposite the first main surface. The semiconductor body comprises a first semiconductor layer of a first conductivity type and a second semiconductor layer of a second conductivity type different from the first conductivity type thereby forming a first pn junction, wherein the first semiconductor layer is more heavily doped than the second semiconductor layer. A side surface of the semiconductor body extending between the first main surface and the second main surface delimits the semiconductor body in a lateral direction comprises a first partial region and a second partial region, wherein the first partial region and the second partial region delimit the first semiconductor layer in regions.

10 Claims, 3 Drawing Sheets

(56) References Cited

U.S. PATENT DOCUMENTS

| | | | |
|---|---|---|---|
| 3,437,886 A | | 4/1969 | Edqvist et al. |
| 3,491,272 A | | 1/1970 | Huth et al. |
| 3,575,644 A | | 4/1971 | Huth et al. |
| 3,579,060 A | * | 5/1971 | Davis .................... H10D 64/20 |
| | | | 257/160 |
| 3,987,479 A | * | 10/1976 | Cornu .................. H10D 62/104 |
| | | | 257/E29.023 |
| 6,054,727 A | | 4/2000 | Voss |
| 7,205,583 B1 | | 4/2007 | Saucedo-Flores |
| 2005/0258448 A1 | | 11/2005 | Barthelmess et al. |
| 2013/0321034 A1 | | 12/2013 | Crane et al. |
| 2014/0151841 A1 | | 6/2014 | Huang et al. |

FOREIGN PATENT DOCUMENTS

| | | |
|---|---|---|
| DE | 102016124670 A1 | 6/2018 |
| EP | 0532941 A1 | 3/1993 |
| EP | 0715351 A1 | 6/1996 |
| JP | 54-163883 A | 11/1985 |
| JP | 60-224268 A | 11/1985 |
| JP | 62-79667 A | 4/1987 |
| JP | 1-91463 A | 4/1989 |
| JP | 1-91464 A | 4/1989 |
| JP | 2013-542597 A | 11/2013 |
| WO | 98/13881 A1 | 4/1998 |
| WO | 2012/041836 A1 | 4/2012 |

\* cited by examiner

SEMICONDUCTOR DEVICE WITH A SIDE SURFACE HAVING DIFFERENT PARTIAL REGIONS

CROSS-REFERENCE TO RELATED APPLICATIONS

This application is US National Stage of International Patent Application PCT/EP2021/081856, filed Nov. 16, 2021, which claims priority to European Patent Application No. 20210372.7, filed on Nov. 27, 2020, both of the contents of which are incorporated herein by reference.

A semiconductor device with a side surface having different partial regions is specified.

In semiconductor devices the surface field at the side surface may have a strong impact on the device performance. In bipolar devices a bevelled pn junction termination may be used to reduce the surface field, wherein both negative and positive bevel designs may apply. In a positive bevel design the cross-sectional area of the semiconductor body is reduced in the direction towards the more lightly doped layer. In contrast, the cross-sectional area increases in a negative bevel design towards the more lightly doped layer.

Symmetrically blocking devices such as thyristors need two blocking pn junctions for forward and reverse blocking. For instance, documents U.S. Pat. Nos. 3,437,886 and 3,575,644 describe thyristors with two positively bevelled junctions. Negative-negative or positive-negative bevel designs may also apply.

However, it has been found that the reverse blocking voltage can be limited in a positive-negative bevel thyristor by a punch through effect caused by the upturning electric field next to the positive bevel.

A problem to be solved is to provide a semiconductor device with an increased reverse blocking voltage capability.

This object is obtained, inter alia, by a semiconductor device according to claim 1. Developments and expediencies are subject of the further claims.

According to at least one embodiment the semiconductor device comprises a semiconductor body extending in a vertical direction between a first main surface and a second main surface opposite the first main surface. The semiconductor body comprises a first semiconductor layer of a first conductivity type and a second semiconductor layer of a second conductivity type different from the first conductivity, thereby forming a first pn junction. The first semiconductor layer is more heavily doped than the second semiconductor layer. A side surface of the semiconductor body extending between the first main surface and the second main surface delimits the semiconductor body in a lateral direction. The side surface of the semiconductor body comprises a first partial region and a second partial region, wherein the first partial region and the second partial region delimit the first semiconductor layer in regions. For example, the second partial region directly adjoins the first partial region. The first partial region delimits the first pn junction in the lateral direction. The second partial region is spaced apart from the first pn junction in vertical direction. The first partial region is arranged at a first angle and the second partial region is arranged at a second angle with respect to the first pn junction wherein the first angle is larger than the second angle.

For example, the side surface comprises a third partial region, the first partial region being arranged between the second partial region and the third partial region, the third partial region directly adjoining the first partial region. The semiconductor body further comprises a second pn junction, the third partial region delimiting the second pn junction in the lateral direction and the first partial region, the second partial region and the third partial region are flat in a cross-sectional view.

In other words, the side surface that laterally delimits the semiconductor body has at least two different partial regions, namely the first partial region and the second partial region, wherein these partial regions laterally delimit the first semiconductor layer and form different angles with respect to the first pn junction. For example the first angle is by at least 1° or by at least 2° or by at least 5° larger than the second angle. Thus the first pn junction terminates at an angle that is larger than the angle of the second partial region arranged further away from the first pn junction.

It has been found that this helps to spread the upturning of the electric field to prevent punch through and increase the reverse blocking voltage if the first pn junction is operated in reverse direction. Thus, the reverse blocking voltage can be increased by a modified shaping of the side surface of the semiconductor body.

Furthermore, when seen along the vertical direction the area of the semiconductor device that is usable for the first pn junction is increased by means of a large first angle, in particular compared to the second angle.

For example, the first semiconductor layer is arranged between the first main surface and the first pn junction. The second semiconductor layer may be arranged between the first pn junction and the second main surface. The first main surface may represent the cathode side and the second main surface may represent the anode side of the semiconductor body or vice versa.

In addition to the first and second semiconductor layer, further semiconductor layers and/or further doped semiconductor regions may be present between the first main surface and the second main surface. The semiconductor body comprises silicon, for instance. Other semiconductor materials such as silicon carbide or gallium nitride may also be used.

According to at least one embodiment of the semiconductor device the first angle is between 5° and 20° inclusive.

According to at least one embodiment of the semiconductor device the second angle is between 0.8° and 5° inclusive.

According to at least one embodiment of the semiconductor device a lateral extent of the first partial region is smaller than a lateral extent of the second partial region when seen along the vertical direction. For instance the first partial region is by at least 5% and at most 90% smaller than the second partial region.

According to at least one embodiment of the semiconductor device the first angle is constant within the first partial region and the second angle is constant within the second partial region. In other words, the first and second angle do not vary within the respective partial regions.

According to at least one embodiment of the semiconductor device, at least one of the first partial region and the second partial region, for instance the first partial region and the second partial region, exhibit traces of a mechanical ablation method. For instance the traces are traces of a grinding method. Using a mechanical ablation method, bevelled side surfaces may be obtained in a reliable and efficient manner. Chemical methods such as etching may be dispensed with. However, chemical methods may be used instead of or in addition to mechanical ablation methods if appropriate.

According to at least one embodiment of the semiconductor device, at least one of the first partial region and the second partial region, for instance the first partial region and the second partial region, exhibit traces of a laser ablation method.

The semiconductor body may further comprise more than one pn junction, for instance a second pn junction, in addition to the first pn junction.

For example, at least one of the first pn junction and the second pn junction extend continuously between two opposite side surfaces of the semiconductor body in a cross-sectional view.

According to at least one embodiment of the semiconductor device, the second pn junction is formed between the second semiconductor layer and a third semiconductor layer of the first conductivity type. Thus, the forward directions of the first pn junction and the second pn junction are opposite to one another. For instance the third semiconductor layer is more heavily doped than the second semiconductor layer.

According to at least one embodiment of the semiconductor device the side surface comprises a third partial region. For instance the first partial region is arranged between the second partial region and the third partial region. For instance the third partial region delimits the second pn junction in the lateral direction. The third partial region is spaced apart from the first pn junction in vertical direction. For example, the third partial region directly adjoins the first partial region.

An angle of the third partial region with respect to the first pn junction may differ from the first partial region. For instance the second angle is between the first angle and the third angle.

According to at least one embodiment of the semiconductor device the third angle is between 20° and 60° inclusive. The third partial region forms a positive bevel for the second pn junction, for example.

Alternatively a negative bevel may be used for the second pn junction. In this case the angle is between 0.8° and 20° for instance.

According to at least one embodiment of the semiconductor device the first pn junction is configured for a reverse blocking voltage of at least 1000 V. For example, the semiconductor device is configured for high voltage applications, for instance above 5000 V or above 8000 V, for example for a rated blocking voltage of 8500 V.

According to at least one embodiment of the semiconductor device the semiconductor device is a thyristor. For example the thyristor is configured as a phase control thyristor (PCT). However, the described configuration of the side surface having different partial regions may also apply for other semiconductor devices with a pn junction.

According to at least one embodiment of the semiconductor device the thyristor has a positive-negative bevel design, wherein the negative bevel comprises the first and second partial region. For instance the positive bevel is formed by the third partial region. Alternatively the thyristor may have a negative-negative bevel design. In this case, the features described in connection with the first semiconductor layer, the first partial region and the second partial region, may also apply for the third semiconductor layer.

In the exemplary embodiments and figures similar or similarly acting constituent parts are provided with the same reference signs. Generally, only the differences with respect to the individual embodiments are described. Unless specified otherwise, the description of a part or aspect in one embodiment applies to a corresponding part or aspect in another embodiment as well.

IN THE FIGURES

The elements illustrated in the figures and their size relationships among one another are not necessarily true to scale. Rather, individual elements or layer thicknesses may be represented with an exaggerated size for the sake of better representability and/or for the sake of better understanding.

Figure 1:
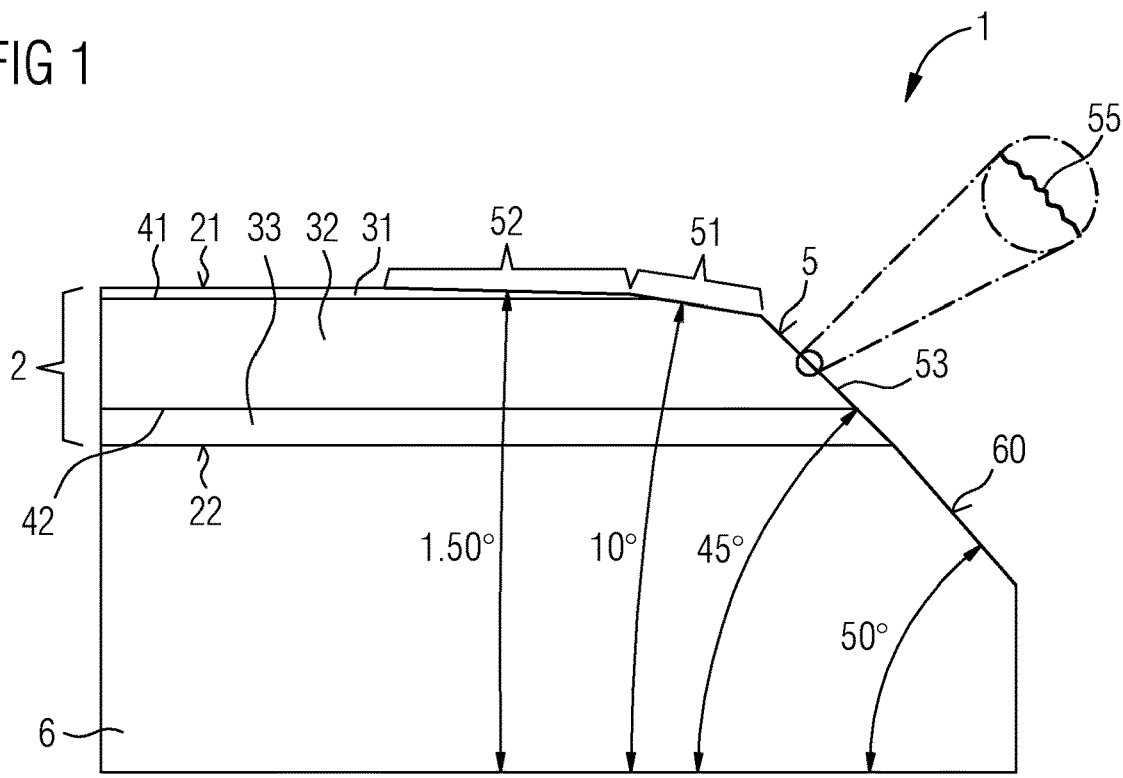
FIG. 1 shows an exemplary embodiment of a semiconductor device in sectional view.

An exemplary embodiment of a semiconductor device 1 is illustrated in FIG. 1 in cross-sectional view. In this exemplary embodiment, the semiconductor device 1 is embodied as a semiconductor device having two blocking pn junctions for forward and reverse blocking. However, the invention may also be used for semiconductor devices having only one pn junction or more than two pn junctions.

Metal electrodes of the semiconductor device 1 such as cathode, anode and gate electrode are not explicitly shown in the Figures.

The semiconductor device 1 comprises a semiconductor body 2 that extends in a vertical direction between a first main surface 21 and a second main surface 22. The semiconductor body 2 comprises a plurality of differently doped partial regions. For the sake of simplicity only, a first semiconductor layer 31, a second semiconductor layer 32 and a third semiconductor layer 33 are shown. However, the semiconductor body may comprise more than three semiconductor layers or differently doped semiconductor regions.

The semiconductor body 2 is arranged on a carrier 6. For instance the semiconductor body 2 is fixed to the carrier 6 by means of a connecting layer such as an adhesive or a solder (not explicitly shown in the figures).

For example the carrier 6 comprises molybdenum or consists of molybdenum. However, other materials may be used for the carrier 6 as well.

A first pn junction 41 is formed between the first semiconductor layer 31 and the second semiconductor layer 32. For instance, the second semiconductor layer 32 is n-doped and the first semiconductor layer 31 and the third semiconductor layer 33 are p-doped or vice versa. For instance the semiconductor body 2 is configured as a semiconductor disk. The semiconductor disk is a silicon wafer, for example. However, other semiconductor materials such as silicon carbide or gallium nitride may also be used.

The first pn junction 41 and the second pn junction 42 extend in lateral direction between side surfaces 5 that laterally delimit the first pn junction 41 and the second pn junction 42. The side surface 5 comprises a first partial region 51, a second partial region 52 and a third partial region 53. These partial regions differ from one another with respect to the angle of the side surface 5 in the respective region with respect to the first pn junction 41.

The first pn junction 41 is laterally delimited by the first partial region 51. Thus, the first partial region 51 laterally delimits in regions the first semiconductor layer 31 and the second semiconductor layer 32. The second partial region 52 extends between the first partial region and the first main surface 21. The second partial region 52 is spaced apart from the first pn junction 41 in vertical direction.

The first angle α (cf. FIG. 2) is between 5° and 20° inclusive, for instance, for example 10° or 14°. The second angle β is between 0.8° and 5° inclusive, for instance, for example 1°.

The first semiconductor layer 31 is more heavily doped than the second semiconductor layer 32 so that the cross-section of the semiconductor device decreases towards the more heavily doped layer. Consequently, the first partial region 51 together with the second partial region 52 forms a negative bevel design for the first pn junction 41.

The third semiconductor layer 33 is more heavily doped than the second semiconductor layer 32 so that the third partial region 53 forms a positive bevel design for the second pn junction 42. The third angle γ between the third partial region 53 and the first pn junction 41 is between 20° and 60° inclusive, for example.

Within the first partial region 51, the second partial region 52 and the third partial region 53, the angle of the side surface 5 with respect to the first pn junction 41 is constant. Partial regions of the side surface 5 being flat in a cross-sectional view may be formed efficiently using a mechanical ablation method. Such a method may result in traces 55 characteristic of the respective ablation method, such as a grinding method. The traces are schematically shown in an enlarged section of the side surface 5 in FIG. 1.

The grinding may be performed such that also material of the carrier 6 is removed so that at least part of a side surface 60 of the carrier 6 has the same angle with respect to the first pn junction 41 as the third partial region 53. Other ablation methods may also be used, for example a laser ablation method, resulting in characteristic traces 55.

Figure 2:
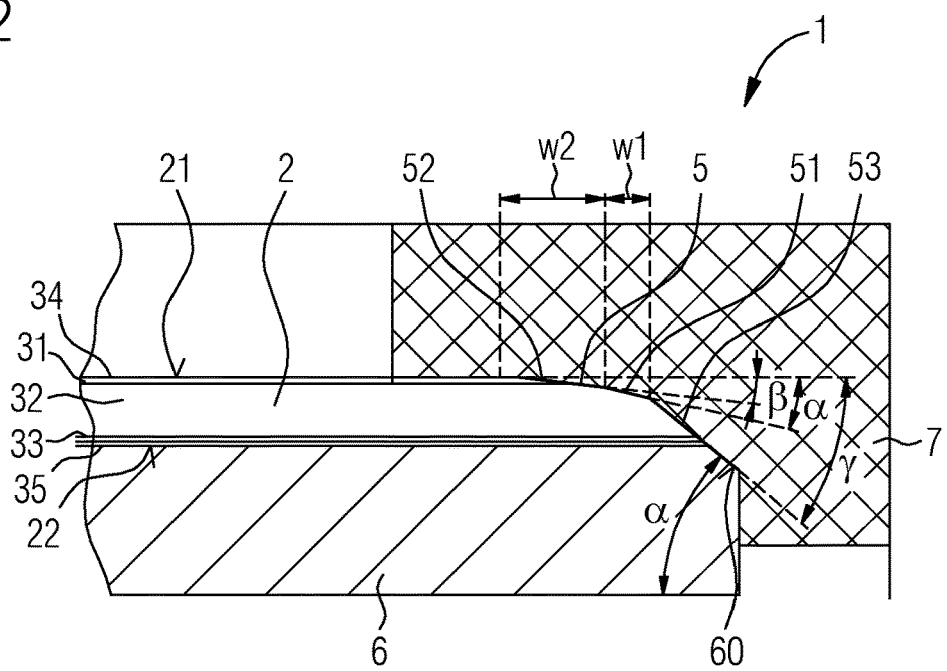
FIG. 2 shows a further exemplary embodiment of a semiconductor device in sectional view.

FIG. 2 illustrates an exemplary embodiment of a semiconductor device 1 wherein the structure of the semiconductor body is shown in more detail. The description of FIG. 1 applies to FIG. 2 as well unless otherwise indicated.

When seen from the first main surface 21 towards the second main surface 22, the semiconductor body 2 comprises a fourth semiconductor layer 34 acting as an $n^+$ layer, the first semiconductor layer 31 as p-layer, the second semiconductor layer 32 as $n^-$ layer, the third semiconductor layer 33 as p-layer and a fifth semiconductor layer 35 as a $p^+$ layer.

Between the fourth semiconductor layer 34 and the first semiconductor layer a further pn junction is formed. This further pn junction, however, does not extend to the side surface 5 in lateral direction.

The above layer structure may be used for a PCT thyristor, for instance. However, the layer structure may be modified within wide limits depending on the application of the semiconductor device 1.

The first main surface 21 represents a cathode side and the second main surface 22 an anode side of the semiconductor body 2, for instance.

The first partial region 51 is used to extend the shallow bevel region formed by the second partial region 52 through the deeply diffused cathode side first pn junction 41.

The side surface 5 of the semiconductor body 2 is surrounded by an insulator 7, such as rubber, in order to protect the otherwise exposed first and second pn junctions 41, 42 at the side surface 5.

When seen along the vertical direction, a lateral extent w1 of the first partial region 51 is smaller than a lateral extent w2 of the second partial region.

For example the lateral extent w1 amounts to 1 mm and the lateral extent w2 of the second partial region 52 amounts to 2.1 mm for a semiconductor body with a thickness (i.e. extent in vertical direction) of 1.42 mm for a thyristor configured for a rated reverse blocking voltage of 8.5 kV.

Figure 3A:
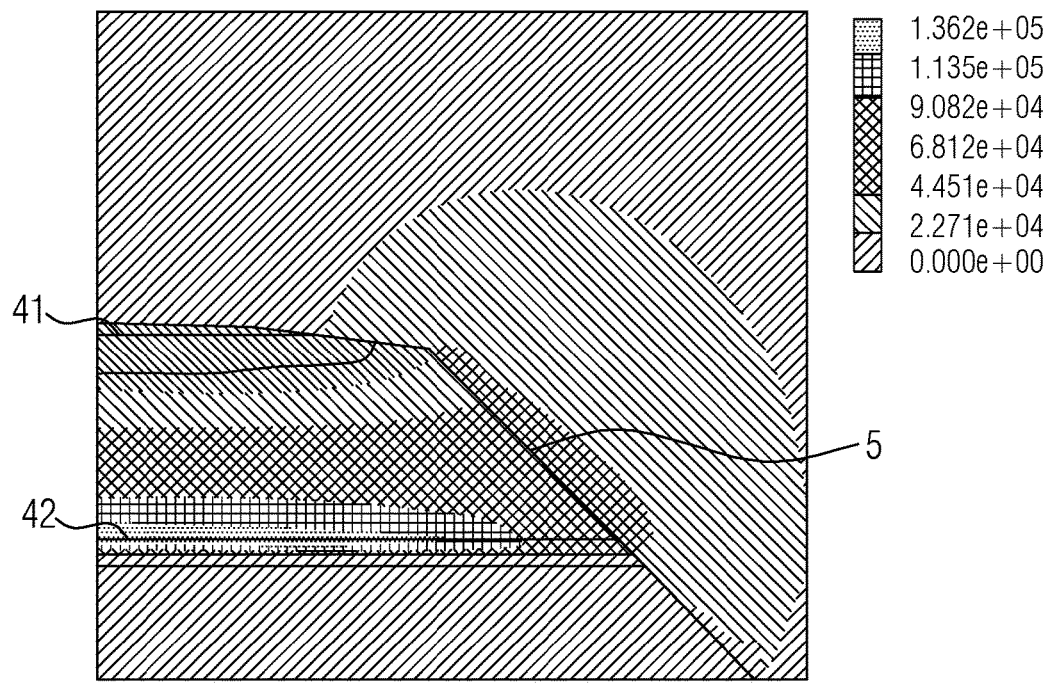
FIG. 3A shows simulation results of the electric field for a semiconductor device according to an embodiment of the semiconductor device described herein.

FIG. 3A illustrates results of electrical simulations of the electrical field for a semiconductor device as described in connection with FIG. 2 at a voltage of 7 kV applied in reverse direction. The simulation is based on a device with a first angle α of 10°.

Figure 3B:
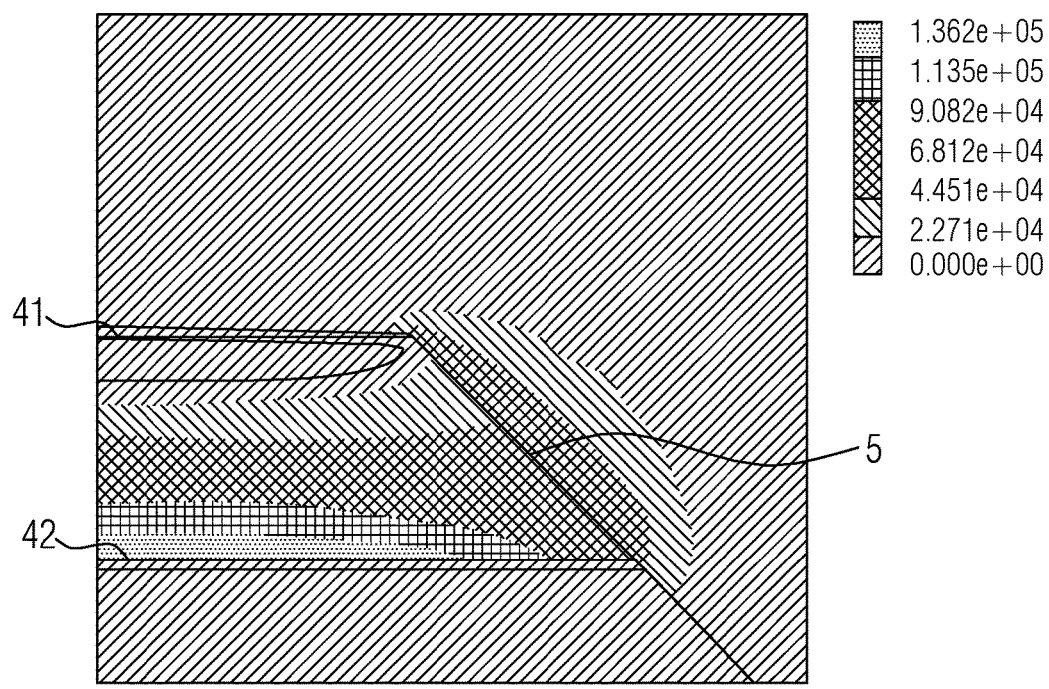
FIG. 3B shows simulation results of the electric field for a reference semiconductor device.

For comparison FIG. 3B shows simulation results for a reference structure without a first partial region between the second partial region 52 and the third partial region 53.

FIG. 3B illustrates that a punch through of the electrical field occurs at a voltage of 7 kV caused by the upturning of the electrical field near the transition to the positive bevel, i.e. between the two different partial regions of the side surface 5.

The simulation results shown in FIG. 3A, in contrast, confirm that high blocking capabilities can be obtained using the described configuration of the side surface 5 of the semiconductor body 2 as a punch through can be avoided.

Figure 4:
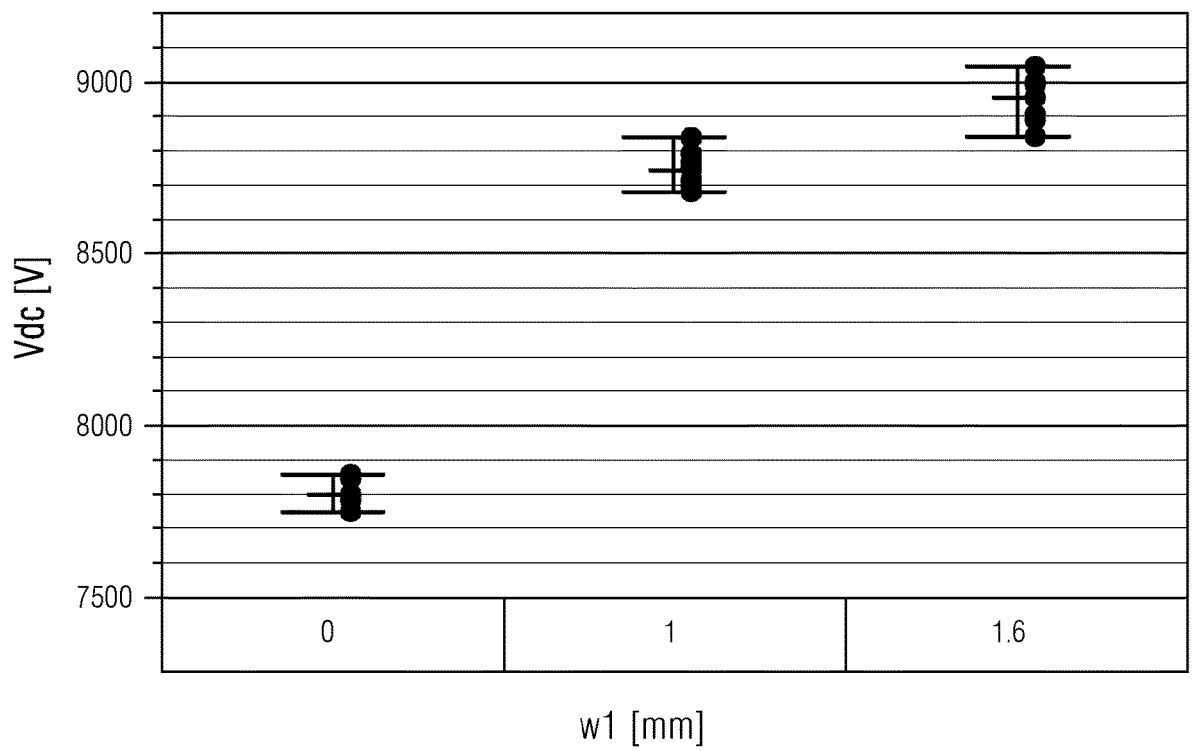
FIG. 4 shows measurements of the blocking voltage Vdc for different semiconductor devices.

This has also been confirmed experimentally as shown by means of the experimental results illustrated in FIG. 4. For the measurements, samples are used having different values w1 for the lateral extent of the first partial 51 wherein a value of 0 mm corresponds to a conventional device with only two different bevels. In each case, the first angle α amounts to 14°.

At 25° C. the DC blocking voltage is significantly increased for the samples having a bevel length of 1 mm or 1.6 mm and an angle of 14° compared to the reference sample with w1=0 mm.

Consequently, the proposed design of the surface 5 of the semiconductor body allows to obtain a semiconductor device 1 such as a thyristor with high blocking voltage characteristics via a modified side surface of the semiconductor body. Thus, it is not necessary to increase the width of the n-base (the second semiconductor layer) of the thyristor until the punch through voltage is moved above the device maximum rated voltage. This solution would have the drawback that an increased thickness of the n-base would reduce the performance of the thyristor.

This patent application claims the priority of European patent application EP 20210372.7, the disclosure content of which is hereby incorporated by reference.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS 1 semiconductor device
2 semiconductor body
21 first main surface
22 second main surface
31 first semiconductor layer
32 second semiconductor layer
33 third semiconductor layer
34 forth semiconductor layer
35 fifth semiconductor layer
41 first pn junction
42 second pn junction
5 side surface
51 first partial region 52 second partial region
53 third partial region
55 traces
6 carrier
60 side surface of carrier
7 insulator
α first angle
β second angle
γ third angle
w1 lateral extent of first partial region
w2 lateral extent of second partial region

The invention claimed is:

1. A semiconductor device with a semiconductor body, the semiconductor body extending in a vertical direction between a first main surface and a second main surface opposite the first main surface, wherein
the semiconductor body comprises a first semiconductor layer of a first conductivity type and a second semiconductor layer of a second conductivity type different from the first conductivity type thereby forming a first pn junction;
the first semiconductor layer is more heavily doped than the second semiconductor layer;
a side surface of the semiconductor body extending between the first main surface and the second main surface delimits the semiconductor body in a lateral direction;
the side surface of the semiconductor body comprises a first partial region and a second partial region;
the first partial region and the second partial region delimit the first semiconductor layer in regions;
the first partial region delimits the first pn junction in the lateral direction;
the second partial region is spaced apart from the first pn junction in the vertical direction; and
the first partial region is arranged at a first angle and the second partial region is arranged at a second angle with respect to the first pn junction wherein the first angle is larger than the second angle;
the side surface comprises a third partial region, the first partial region being arranged between the second partial region and the third partial region, the third partial region directly adjoining the first partial region;
the semiconductor body further comprises a second pn junction, the third partial region delimiting the second pn junction in the lateral direction; and
the first partial region, the second partial region and the third partial region are flat in a cross-sectional view;
the third partial region is arranged at a third angle with respect to the first pn junction, wherein the third angle is larger than the first angle; and
the third angle is between 20° and 60° inclusive.

2. The semiconductor device according to claim 1, wherein the first angle is between 5° and 20° inclusive.

3. The semiconductor device according to claim 1, wherein the second angle is between 0.8° and 5° inclusive.

4. The semiconductor device according to claim 1, wherein a lateral extent of the first partial region is smaller than a lateral extent of the second partial region when seen along the vertical direction.

5. The semiconductor device according to claim 1, wherein the first angle is constant within the first partial region and the second angle is constant within the second partial region.

6. The semiconductor device according to claim 1, wherein the first partial region and the second partial region exhibit traces of a mechanical ablation method.

7. The semiconductor device according to claim 1, wherein the first partial region and the second partial region exhibit traces of a laser ablation method.

8. The semiconductor device according to claim 1, wherein the second pn junction is formed between the second semiconductor layer and a third semiconductor layer of the first conductivity type.

9. The semiconductor device according to claim 1, wherein the semiconductor device is a thyristor.

10. The semiconductor device according to claim 9, wherein the thyristor has a positive-negative bevel design, wherein the negative bevel comprises the first and second partial region.

* * * * *